US006949959B2

(12) United States Patent
Zaitsev

(10) Patent No.: US 6,949,959 B2
(45) Date of Patent: Sep. 27, 2005

(54) METHOD FOR CONVERTING ELECTRIC SIGNALS AND A CONVERTER THEREFOR

(75) Inventor: Georgy Mikhailovich Zaitsev, Moscow (RU)

(73) Assignee: Advanced Micro Antennas LLC, McLean, VA (US)

( * ) Notice: Subject to any disclaimer, the term of this patent is extended or adjusted under 35 U.S.C. 154(b) by 297 days.

(21) Appl. No.: 10/381,852

(22) PCT Filed: Sep. 3, 2001

(86) PCT No.: PCT/RU01/00361

§ 371 (c)(1),
(2), (4) Date: Mar. 28, 2003

(87) PCT Pub. No.: WO02/27948

PCT Pub. Date: Apr. 4, 2002

(65) Prior Publication Data

US 2005/0099825 A1    May 12, 2005

(30) Foreign Application Priority Data

Sep. 28, 2000  (RU) .............................. 2000124758

(51) Int. Cl.[7] .............................................. H03K 9/06
(52) U.S. Cl. ........................... 327/39; 327/47; 332/117
(58) Field of Search ........................... 327/39, 40, 36, 327/47; 332/117

(56) References Cited

U.S. PATENT DOCUMENTS 3,229,231 A      1/1966  Saraga
5,896,049 A  *  4/1999  Saunders et al. .............. 327/48
6,005,381 A  *  12/1999  Saunders et al. ......... 324/76.39

FOREIGN PATENT DOCUMENTS

DE            1 081 510         5/1960

* cited by examiner

Primary Examiner—Bao Q. Vu
(74) Attorney, Agent, or Firm—Burns, Doane, Swecker & Mathis, L.L.P.

(57) ABSTRACT

The invention relates to signal conversion devices to be used for the receiving radio devices. The attained technical result is the detection and conversion of signals in an electrical two-terminal device, a data loss level being minimal. A converting element is supplied with input signals, interaction of the fields of said signals in the converting element material is provided, which interaction is accompanied with the energy interchange resulting in appearance of the efficient electromotive force, and extracted is the converted signal complying with the following ratio:

Figure 1A:
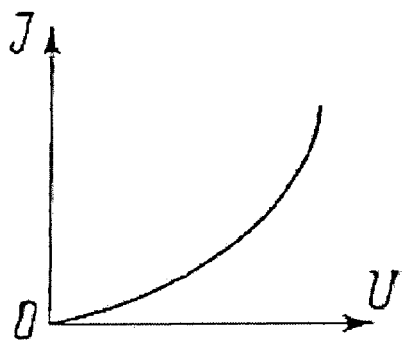

$$U'(t) = -\frac{\gamma[R_x\{\Sigma U_i(t)\cdot|U_o(t)| + U_o(t)\cdot|\Sigma U_i(t)|\}]}{x_o l}$$

where U'(t) is the efficient electromotive force in the converting element, $R_x$ is Hall coefficient of the converting element conductive material (C/m$^3$); l is length of the converting element along the current direction, (m); $x_o$ is the least one of linear dimensions of the converting element cross-section that is perpendicular to direction of the current flowing therein, (m); $\gamma=\tau\cdot\epsilon_o$; $\epsilon_o$ is electric constant, $\epsilon_o\approx10^{-11}$ C/V·m, $\tau$ is dimensions factor that represents a degree of interrelationship of the fields in a conductive medium $\Sigma U_i(t)$, where i=1 . . . n is the combined voltage of the input convertible signals; Uo(t) is voltage of the input converting signal; at that, the ratio between the physical parameters and geometric parameters of the converting element and the sum of voltages of the input signals is selected with regard to the condition $2\gamma|R_x|U/x_o l \geq 1$, where U is sum of voltages of the input signals.

17 Claims, 6 Drawing Sheets

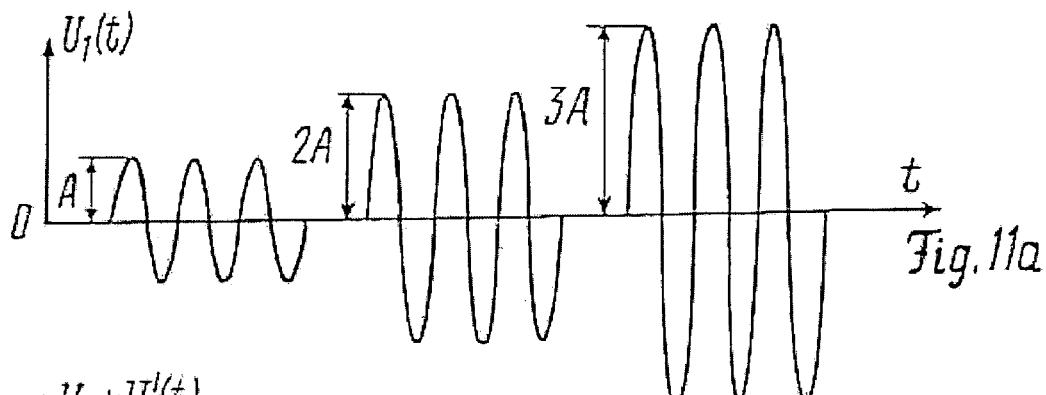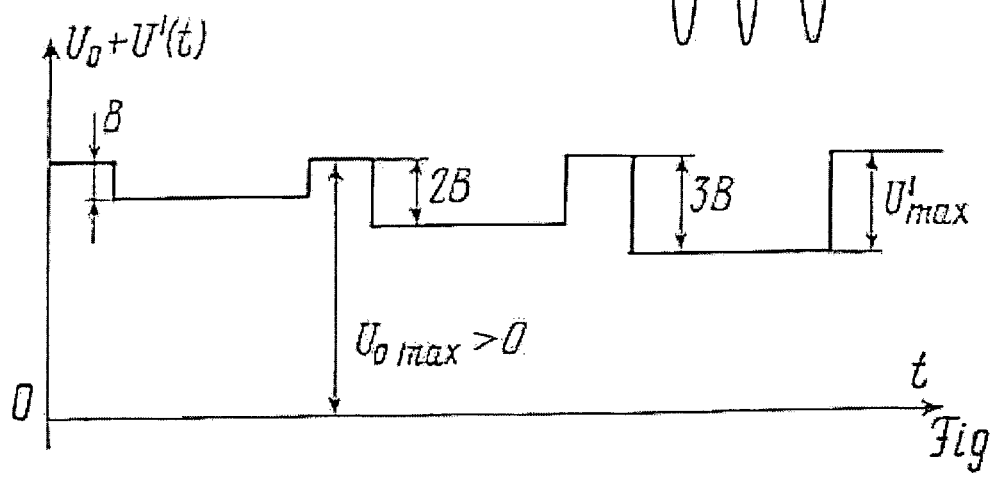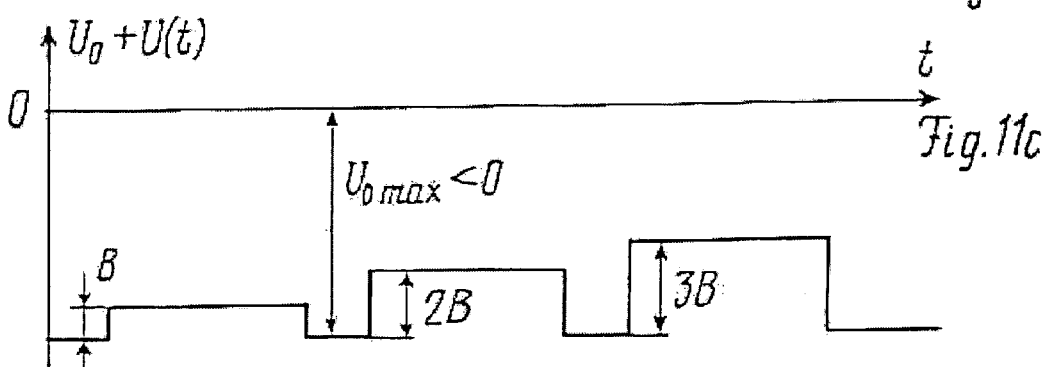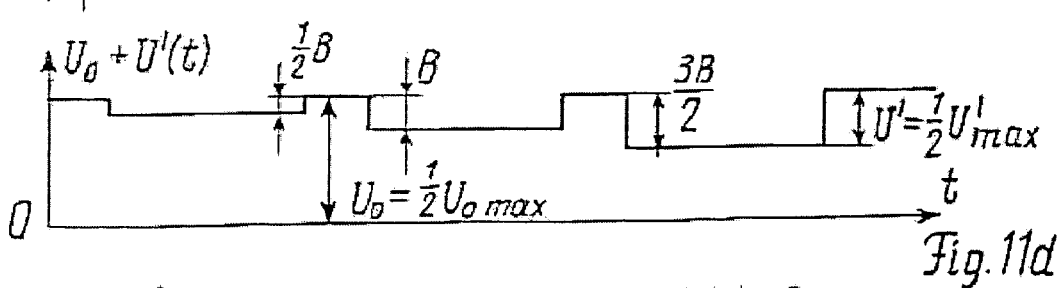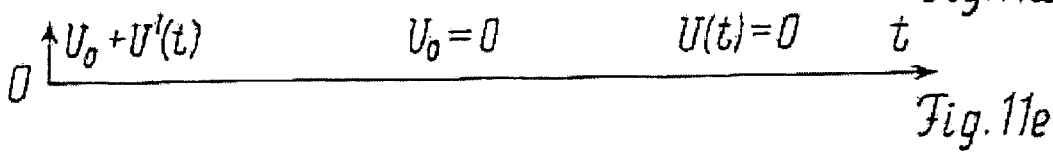

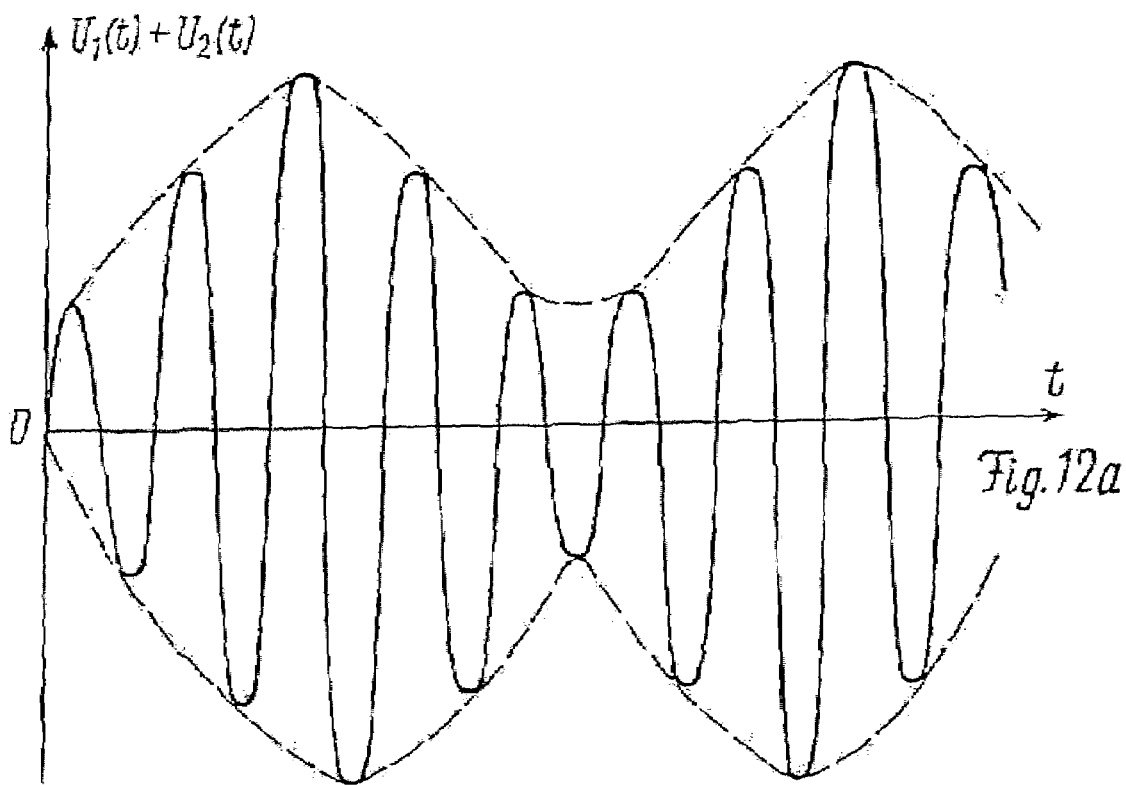
Fig. 12a
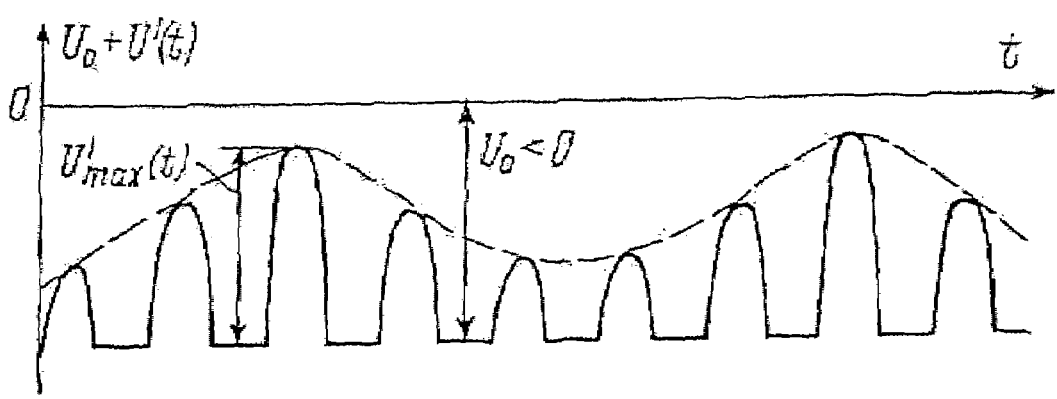
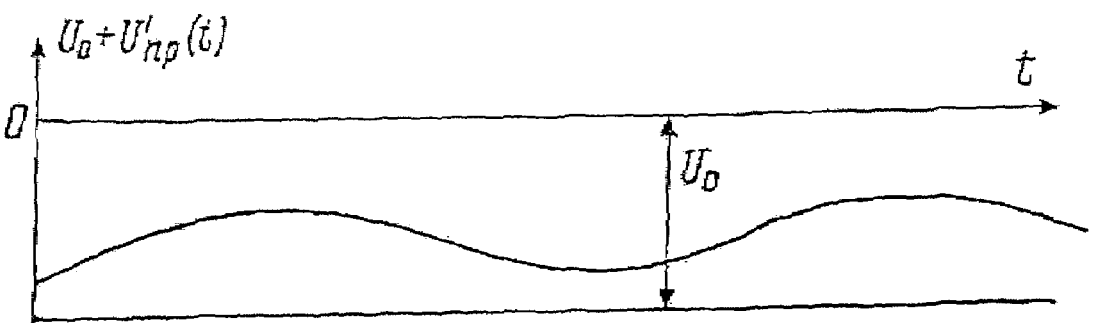
Fig. 12b

METHOD FOR CONVERTING ELECTRIC SIGNALS AND A CONVERTER THEREFOR

The invention relates to radio engineering, in particular it relates to the devices for conversion of signals, and can be suitably used in designing of the receiving radio devices.

Detection and (frequency-) conversion of signals can be implemented using the known electronic devices having the non-linear volt-amper characteristic: two-terminal diodes of all types, or having the non-linear characteristic of the parametric dependence of conductivity on the action effected by an external signal; radio tubes, transistors. Thus, for example, a conventional converter in the form of a crystal (semiconductor) diode can be used both in detection and frequency-conversion of signals. However, this converter has such drawbacks as a low transmission coefficient in the detection mode, and a low frequency conversion coefficient in the superheterodyne reception mode.

Drawbacks of the known signal converters are due to their features in respect of the detection and frequency-conversion modes, a separately described below.

A) Signal Detection Mode.

All existing gate-based devices, such as tube diodes, semiconductor diodes have a very low value of $\partial I/\partial U$ derivative of $I(U)$ function, i.e. that of conductivity in case of small values of signal U acting at their input (FIG. 1$a$) and, consequently, a very low transmission coefficient G of circuit $R_d$, $R_{ld}$ (FIG. 2$a$), where $R_d$ is diode dynamic resistance determined as $\partial U/\partial I$; $R_{ld}$ is load resistance, $G=R_{ld}/R_d$. When direct voltage $E_o$ is applied to circuit $R_d$, $R_{ld}$ and shifts the operating point (FIGS. 1$b$, 2$b$), the output signal is proportional to $U^2$ and has a low value. Whereas noise power $P_n$—due fluctuations caused by the particle heat motion and produced by any active resistance into the matched, i.e. equal to the resistance, load $R_{ld}$ in $\Delta F$ frequency band—is $$P_n = kT\Delta F \qquad (1)$$

where k is Boltzmann constant, T is absolute temperature whereat a device is operated, then mean square of the noises voltage across resistance $R_d$ can be expressed as:

$$e^2{}_n = 4kT\Delta F R_d \qquad (2)$$

Thus, registration of the detected signal across load $R_{ld}$ (FIG. 2$a$) is possible only when the input signal voltage $U_{inp} > e_n$, i.e. when $R_d$ has great values, a small signal is not discernible against the noise background.

B) Frequency-Conversion Mode (Superheterodyne Reception).

In this mode, said known converters for frequency-conversion of signals can be used just owing to non-linearity of their volt-amper characteristic (FIG. 1). If the input signal is the sum of voltages $U_1(t)+U_2(t)$, where $U_1(t)=U_1 \sin \omega_1(t)$, $U_2(t)=U_2 \sin \omega_2(t)$, when $U_2 \gg U_1$, and dependence $I(U)$ is $$I = kU^2 \qquad (3)$$

where k is dimension factor, and value kU is instantaneous value of conductivity, then $$I(t)=kU_1{}^2(t)+2kU_1(t)U_2(t)+kU_2{}^2(t) \qquad (4)$$

Hence, current I(t) comprises components of signals of intermediate frequency $I_{int}$, $U_{int}=I_{int}R_d$:

$$U_{int1}(t)=U_{int1} \sin(\omega_2-\omega_1)t;\ U_{int2}(t)=U_{int2} \sin(\omega_2-\omega_1)t; \qquad (5)$$

Figure 3A:
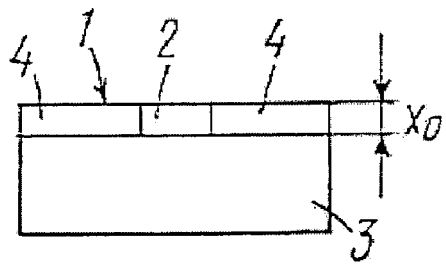
Figure 3B:
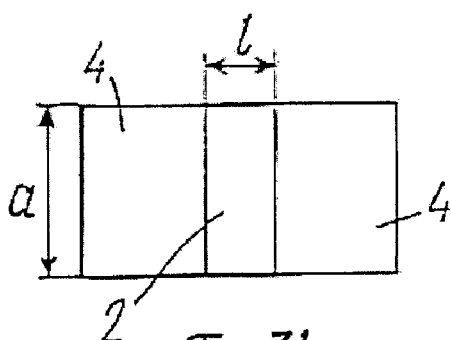

If $U_1(t)$ is the received signal, $U_2(t)$ is the heterodyne voltage; then according to (4) derivative $\partial I(t)/\partial U(t)=2kU_2(t)$, and signal power $U_1(t)$ will be equally distributed between signals $U_{int1}$, $U_{int2}$, and that being only during one half-period $\omega_1(t)$, because the second half-period $\omega_1(t)$, when $\omega_1 \approx \omega_2$, is cut off by the diode (FIG. 3).

Thus, even when selection of mode of such converter is optimal, when the value that is inverse to $\partial I(t)/\partial U(t)$ represents the matched load of the input circuit in which $U_1(t)$ is transmitted, the power of the converted signal $P_{cd1}$ or $P_{cd2}$ is still four times less than power P1(t) of the input signal. Ratio $P_{cd}P_1=\eta$–conversion ratio; $\eta \leq 0.25$ or –6 dB.

At that, the noise characteristics of the converted signal with respect to the input signal $U_1(t)=U_{inp}$ deteriorate by value of η, $$P_{cd}/P_c=(P_{inp}/P_n)\eta \qquad (6)$$

and, consequently, the threshold sensitivity of a heterodyne receiver falls.

The above-discussed effect of the thermal noise is not the only interference factor. When an electric field is applied to a semiconductor, the following noises emerge: shot noise, flicker noise (at low frequencies), modulating noise in diodes having a great series resistance for direct current.

In view of the foregoing, the object of the invention is to provide a converter that will be free of said drawbacks intrinsic to the known converters, that will detect and convert signals in an electrical two-terminal device so that the loss level of the data transmitted by such signals will be minimal.

In particular, the object of the invention consists of providing an element in the electric circuit (two-terminal device) that will provide the following advantages; for the signal detection mode—the linear dependence of output voltage on input voltage, and an high transmission coefficient; for the signal frequency-conversion mode—a considerable increase in the conversion ratio; and that will have no other noise effects than the thermal ones.

The technical result to be attained: for the signal detection mode—to provide the linear dependence of output voltage on input voltage, and an high transmission coefficients; and for the frequency-conversion mode—to provide a considerable increase in conversion ratio, while maintaining the noise factor at least at the level of the most pertinent prior art.

Said technical result is to be achieved as follows: an electric signal converter comprises a converting element, in particular a two-terminal element made of a conductive material and intended for being supplied with at least two input signals and for extracting a converted signal, whereby the ratio between the physical parameters and geometric parameters of the converting element and the sum of voltages of the input signals satisfies the following condition:

$$2\gamma|R_x|U/x_o l \leq 1,$$

where U is sum of voltages of the input signals;

$R_x$ is Hall coefficient of a converting element conductive material, (C/m³);

l is length of the converting element along the current direction, (m);

$x_o$ the least one of linear dimensions of the converting element cross-section that is perpendicular to direction of the current flowing therein, (m);

$\gamma = \tau \cdot \epsilon_o$; $\epsilon_o$ is electric constant, $\epsilon_o \approx 10^{-11}$ C/V·m, τ is dimensionless factor that represents a degree of interrelationship of the fields emerging in a conductive material under action of the input signals and being within the range of $10^{-3} \div 10^{-2}$.

Further, voltage of at least one of the input signals is considerably greater that that of each of other input signals.

The converting element can be implemented in the form of a thin film, $x_o$ thick, on a dielectric substrate and provided with leads disposed in the plane of said film distance l.

A converting element can be also implemented in the form of a cylinder having radius $x_o$ and length l, provided with leads connected to ends of the cylinder.

Besides, the converting element can be also implemented in the form of a fine-grained structure having linear dimensions of a grain of the order of $x_o$, l, provided with leads to provide contact at least with one grain, said fine-grained structure can be disposed on a substrate being one of the leads, the other lead directly contacting with said fine-grained structure material grain and having the contact area whose linear dimensions are of the order of those of the grain.

Further, the converting element can be at least one micro-asperity on the surface of said material, having height l of the micro-asperity and its cross-section size $x_o$, and has a lead connected to the micro-asperity apex.

A material having a high value of Hall coefficient is preferably selected as the converting element conductive material.

Said technical result is also to be attained through a method for converting electrical signals, comprising the steps of: providing a converting element in the form of a two-terminal device made of a conductive material; applying to said converting element at least two input signals; converting the input signals by providing interaction of fields of said signals in the converting element material, which interaction is accompanied with the energy interchange resulting in emergence of an efficient electromotive force of the conversion; and extracting the converted signal that satisfies the following ratio:

$$U'(t) = \frac{-\gamma |R_x| \{\Sigma U_i(t) \cdot |U_o(t)| + U_o(t) \cdot |\Sigma U_i(t)|\}}{x_o l}$$

where $U'(t)$ is the efficient electromotive force across the converting element caused by action of voltages of the input signals, $R_x$ is Hall coefficient of the converting element conductive material ($C/m^3$); l is length of the converting element along the current direction, (m); $x_o$ is the least one of linear dimensions of the converging element cross-section that is perpendicular to direction of the current flowing therein, (m); $\gamma = \tau\epsilon_o$; $\epsilon_o$ is electric constant, $\epsilon_o = 10^{-11}$ C/V·m, $\tau$ is dimensionless factor that represents a degree of interrelationship of the fields emerging in a conductive medium and is selected within the range of $10^{-3} \div 10^{-2}$; $\Sigma U_i(t)$, where i=1 . . . n is the combined voltage of the input convertible signals; Uo(t) is voltage of the input converting signal.

at that, the ratio between physical parameters and geometric parameters of the converting element and sum of voltages of the input signals is selected according to the following condition:

$(2\gamma |R_x| U)/(x_o l) \geq 1$, where U is voltage across the converting element, equal to sum of voltages of the input signals.

Voltage Uo(t) of the input converting signal is preferably selected to be significantly greater than voltage of each of the input convertible signals, and in such case power of the converted signal is provided by the power take-off from the input converting signal, and extraction of the converted signal is done by an intermediate frequency filter or using a full-wave circuit through compensation of the combined voltage $\Sigma U_i(t)$ of the input convertible signals at the electric neutral point of said circuit.

To obtain the converted signal having a low value of the intermediate frequency as the input converting signal, a harmonic signal Uo(t) having a frequency proximate to half the frequency of the convertible input signal is selected. Further, as the input converting signal Uo(t), voltage of a direct current source can be selected; thereby conversion of the input signals is carried out in the form of the linear detection.

In devising the invention, the author assumed that said objective could be achieved, in principle, using only the linear two-terminal devices—resistors, i.e. a converter according to the invention must have, at least in a certain range of the voltages acting thereon, the linear volt-amper characteristic. At that, in the absence of the non-linear dependence of I(U), the effect of signal conversion may be obtained only in the case if in the linear two-terminal device structure provided is such interaction of electromagnetic fields associated with the input signals that will result in appearance of the electromotive force of interrelationship of signals. Thus, the author has ascertained that the process of signal conversion in a linear two-terminal device is provided in the presence of the energy interchange between the fields of the signals acting on said device. The effect of such electrodynamic mode is the negative slope of dependence $U_{int}(I)$, i.e. $\partial U_{int}/\partial I < 0$, which indicates the energy take-off.

As a result of the carried-out theoretical investigations and experiments the author has ascertained that in a conductor, in particular a homogenous and isotropic conductor, being subjected to sum of external voltages, electromotive force of $U'(t)$ interrelationship appears and is expressed analytically as follows:

$$U'(t) = \frac{-\gamma |R_x| \{\Sigma U_i(t) \cdot |U_o(t)| + U_o(t) \cdot |\Sigma U_i(t)|\}}{x_o l} \quad (7)$$

where $U'(t)$ is the efficient electromotive force developed in the converting element, caused by voltages of the input signals, $R_x$ is Hall coefficient of the converting element conductive material ($C/m^3$); l is the length of the converting element along the current direction, (m); $x_o$ is the least one of linear dimensions of the converting element cross-section that is perpendicular to direction of the current flowing therein, (m); $\gamma = \tau\epsilon_o$; $\epsilon_o$ is electric constant, $\epsilon_o \approx 10^{-11}$ C/V·m, $\tau$ is dimensionless factor that represents a degree of interrelationship of the fields emerging in a conductive medium, being within the range of $10^{-3} \div 10^{-2}$; $\Sigma U_i(t)$, where i=1 . . . n is the combined voltage of the input convertible signals; Uo(t) is voltage of the input converting signal.

Figure 1B:
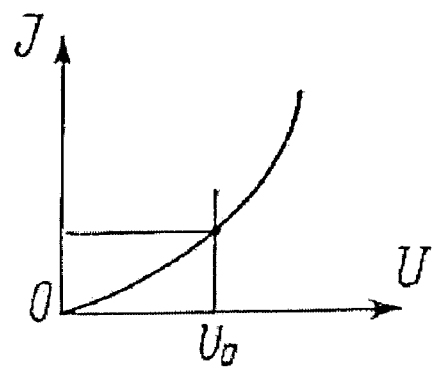
Figure 2A:
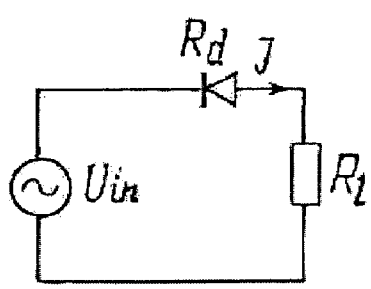
Figure 2B:
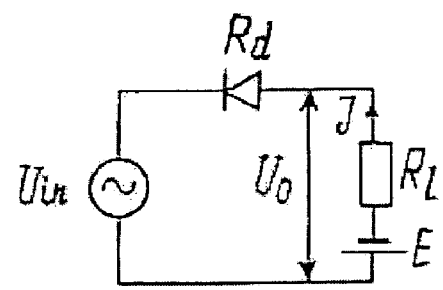
Figure 7:
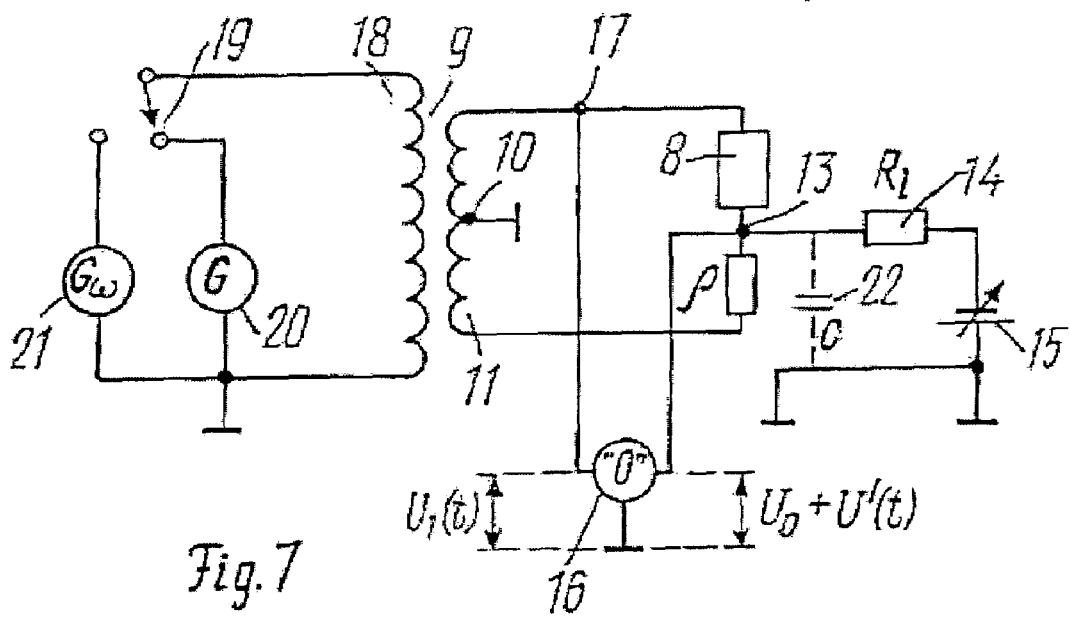
Figure 8:
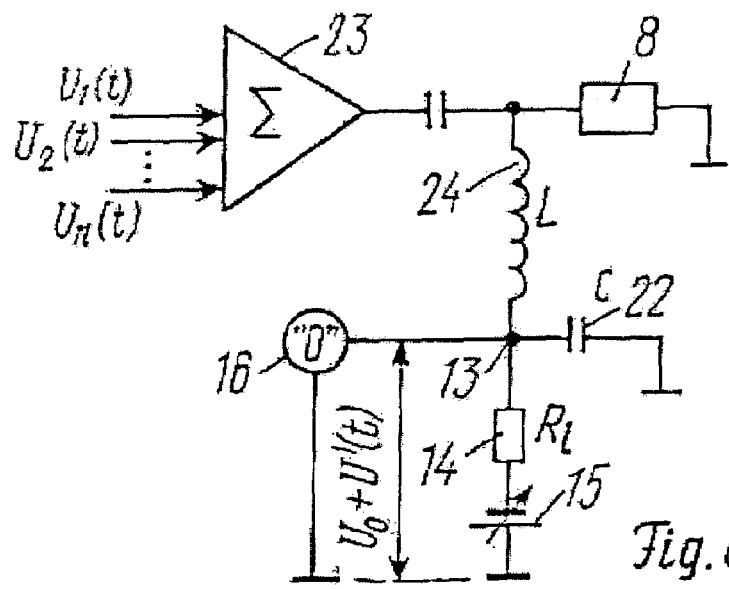

The invention is explained by examples of its embodiment shown in figures, wherein FIGS. 1a, 1b—volt-amper characteristics of the prior art electric signal converters;

FIGS. 2a, 2b—circuits that comprise the prior art electric converters;

FIGS. 3–6—versions of implementation of a converting element of the electric signal conversion device according to the invention;

FIGS. 7, 8—circuits that comprise the electric signal conversion device according to the invention;

FIGS. 9–12—diagrams that describe operation of the electric signal conversion device according to the invention.

FIGS. 3–6 show examples of possible versions for embodying converting element 1 of the converter according to the invention. As FIG. 3 illustrates, converting element 1 is thin-film conductive coating 2, for example, applied upon insulating substrate 3. Dimensions $x_o$, l, where l is length of converting element 1 along the current direction; $x_o$ is linear dimension of cross-section of converting element 1, which cross-section is perpendicular to the current direction, are selected from ratio (7). Dimension a defines a predetermined value of resistance of the converting element. Leads of the converter in the form of contact pads 4, whose resistance is negligible as compared with value of resistance of thin-film coating 2, provide the possibility to couple converting element 1 into a circuit. As the material of thin-film coating 2, any conductor having an high value of Hall coefficient can be selected, e.g.

1) metals:
   Fe ($R_x \approx 10^{-9}$ C/m$^3$), Ni ($R_x \approx 1.5 \cdot 10^{-9}$ C/m$^3$),
   Bi ($R_x \approx 10^{-7}$ C/m$^3$), Sb ($R_x \approx 10^{-8}$ C/m$^3$),
   Gd ($R_x \approx 3 \cdot 10^{-7}$ C/m$^3$),
2) alloys: MnSb and CrTe ($R_x \approx 10^{-6}$ C/m$^3$);
3) semiconductor materials: Si, Ge, etc, with admixtures that provide predetermined values of conductivity of a material and Hall coefficient, under the condition that the technique used for applying the contact pads excludes formation of p-n or n-p transitions therebetween and the element 1 material,
4) ferrites of diverse types.

Figure 4A:
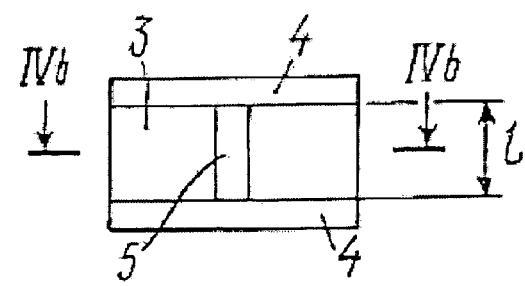
Figure 4B:
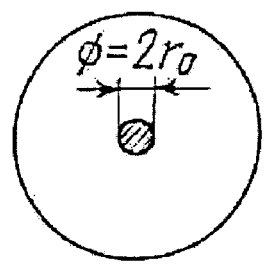
Figure 5:
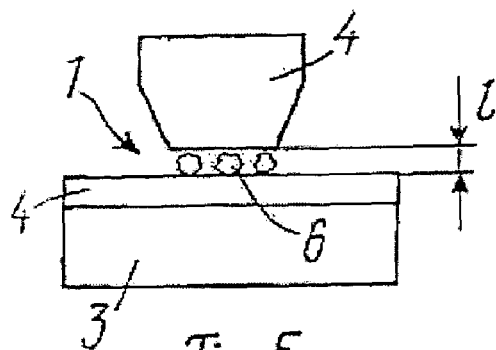

FIG. 4 shows the second embodiment of converting element 1 implemented in the form of cylindrical conductor 5 that is melted-in (or introduced by another method) into the opening, with radius, $r_o$, in insulating body 3 (of the substrate) and has l length (length of converting element 1). Contact pads (leads) 4 are applied on the end faces of substrate 3. FIG. 5 illustrates the third possible embodiment of converting element 1 in the form of a fine-grained structure having grain 6 linear dimensions of the order of $x_o$, l, provided with leads 4 to ensure contact with at least one grain 6.

Figure 6:
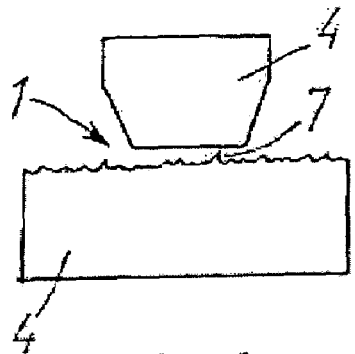

FIG. 6 illustrates the fourth possible embodiment of converting element 1 in the form of at least one micro-asperity 7 on the surface of a conductive material, having height l, cross-section $x_o$; and said element has lead 4 connected to apex of micro-asperity 6.

FIG. 7, 8 represent versions of circuits comprising the electric signal converter according to the invention.

According to FIG. 7; electric signal converter 8 is coupled into a full-wave conversion circuit that includes transformer 9 that is a low-, or high-frequency transformer, depending on the frequency of the convertible signals, and having mid-point 10 of secondary winding 11. Output voltage of secondary winding 11 acts upon two in-series connected elements: converter 8 and balancing resistor 12 whose resistance is ρ, that is the resistance value of converter 8. The node of connection of said elements is point 13 of the electric neutral point, for the voltage developed across secondary winding 11. To point 13 connected is resistor $R_{ld}$—load 14, and controllable direct current source 15 connected in series thereto; operation mode of said source allowing the input voltage polarity to change and, consequently, provides the possibility of changing of potential at point 13 in the course of operation. Registering instrument 16, e.g. in a two-beam oscilloscope, allows the possibility of simultaneous measurement of voltage at point 13 and point 17, i.e. measurement of the input voltage in converter 8 in a corresponding phase. Impulse generator 20 or harmonic oscillation generator 21 can be alternately connected to primary winding 18 using switch 19. Further, the circuit provides for blocking of load 14 by capacitor 22.

FIG. 8 illustrates the second version of operation of converter 8 in the mode of signal frequency-conversion. Conversion 8 is connected to output summer 23 harmonic signals. Direct voltage source 15, via load 14 and choke 25, is also connected to input of converter 8. Registering instrument 16 registers the intermediate frequency voltage at point 13; the action of harmonic oscillations being blocked by capacitor 22.

Operation of said electric signal converter is explained below referring to FIGS. 7 and 8.

First, considered is the circuit shown in FIG. 7, which circuit can be used both for the mode of linear detection of signals, and for the mode of their frequency-conversion.

Figure 9A:
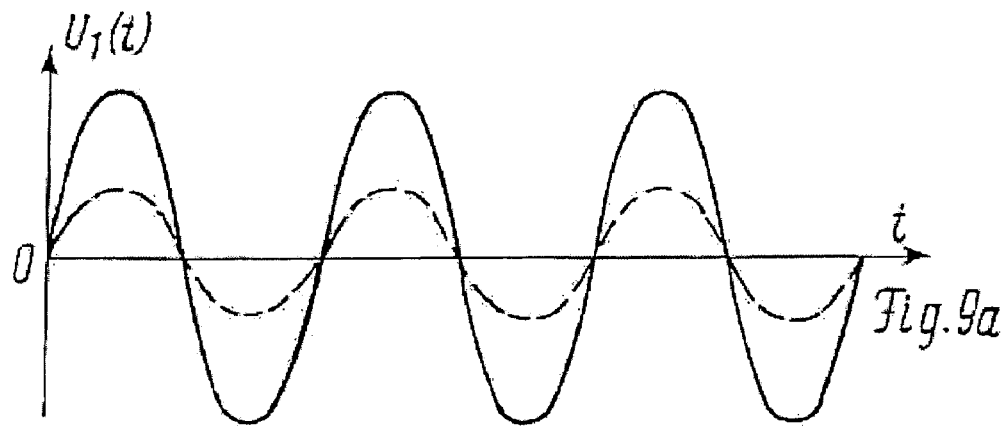
Figure 9B:
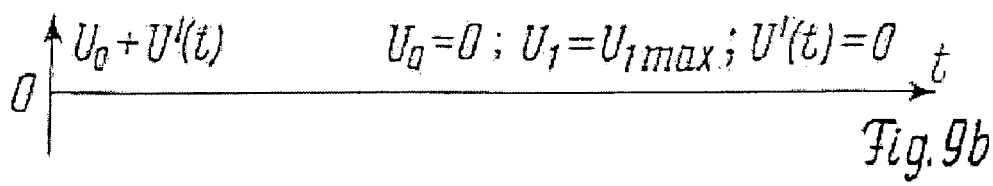

For the reason that converter 8 and balancing resistor 12 have equal value of resistance, then in any functional relationship U(t) of the input signal, that acts upon primary winding 18 of transformer 9, and signal is electrically neutralised at point 13, and registering instrument 16 can indicate only the value of voltage $U_o$; caused by action of controllable direct current source 15, an indicate appearance of the efficient electromotive force in converter 8, i.e. value U'(t). When switch 19 is connected to harmonic oscillation generator 21 in secondary winding 11 at point 17, the operating voltage will be: $U_1(t)=U_1 \sin \omega_1 t$ (FIG. 9a). When the output voltage of controllable source 15 is zero, value $U_o$ at point 13 zero as well, and registering instrument 16 indicates the absence of any signals (FIG. 9b). When $U_o$ grows from zero to $U_{max}$, then instrument 16 registers at point 13 the combined value of $U_o$ and that of the converted signal U'(t), the latter representing the result of half-wave detection of signal $U_1(t)$—under the condition of maintaining of the linear dependence of U'(t) both on value of the convertible signal $U_1(t)$ itself and value $U_o$; in the case—the converting signal, and that being in the phase that corresponds to polarity. $U_o$ (FIGS. 9c and 9d), i.e. in strict conformance with expression (7).

The energy relationship of the signals that act upon converter 8 can be inferred from expression (7). If P'(t) is instantaneous value of the power developed by the efficient electromotive force, than it follows from expression (7) that:

$$P'(t)=\alpha|U_1(t)|U_o^2+\alpha|U_o|U_1^2(t) \qquad (8)$$

where $\alpha=\gamma|x_o|\rho$

Figure 9C:
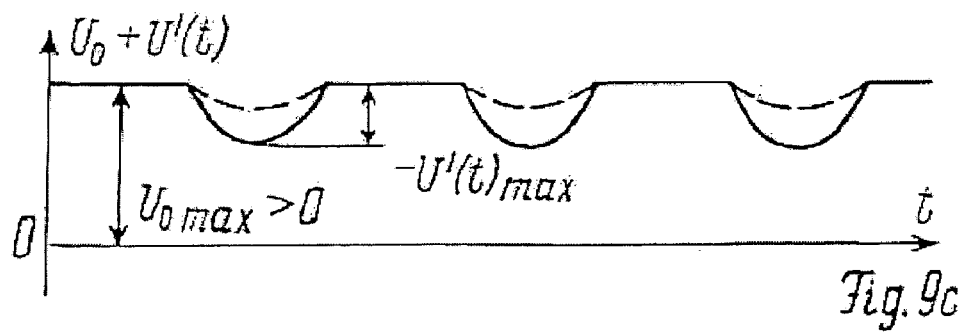
Figure 9D:
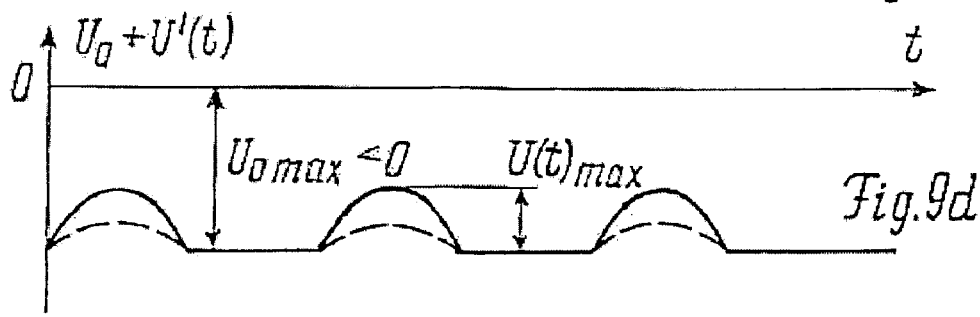
Figure 9E:
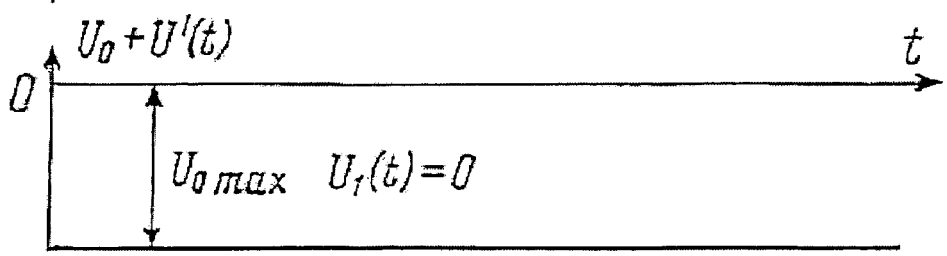
Figure 10A:
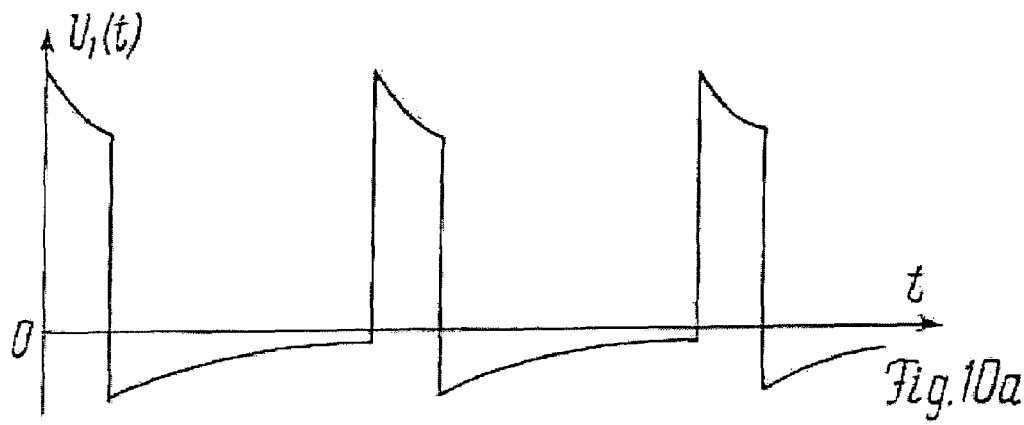
Figure 10B:
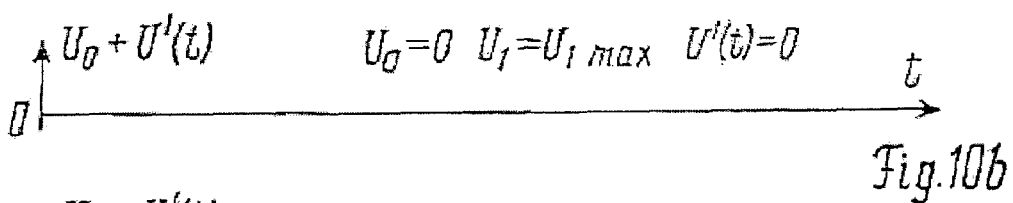
Figure 10C:
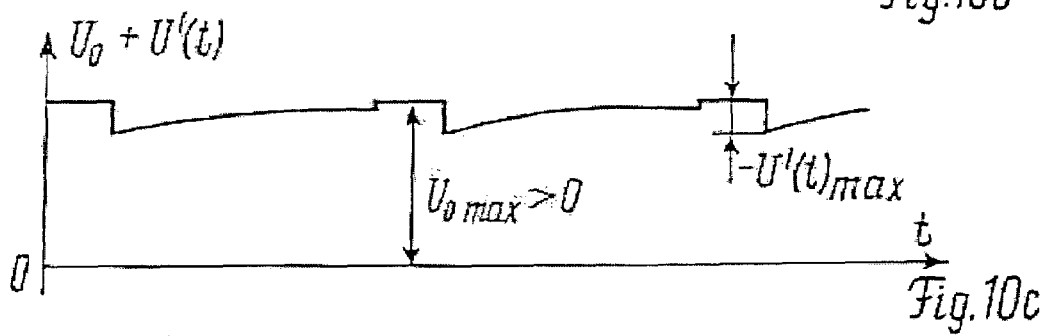
Figure 10D:
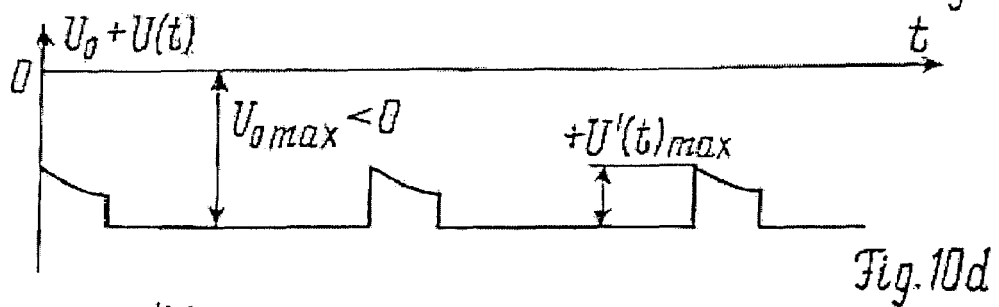
Figure 10E:
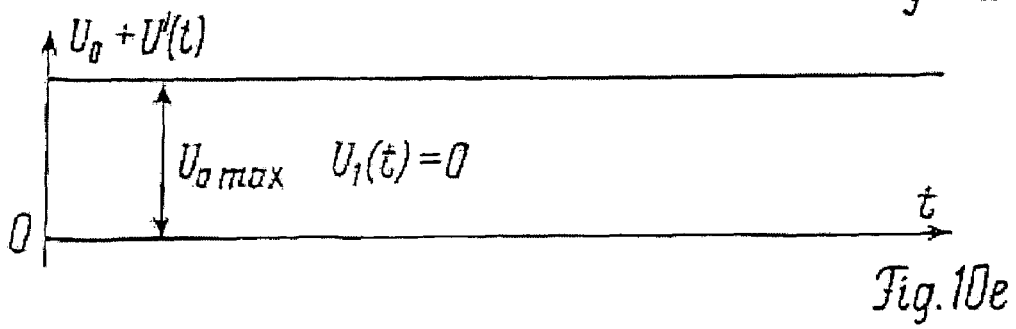

Expression (8) represents the process of energy interchange between $U_1(t)$ and $U_o$, wherein it is obvious that when $U_o >> U_1$, then power P'(t) of the converted signal U'(t) is realised mainly due to signal $U_o$, i.e., energy is taken off from the direct current source. This process is illustrated in FIGS. 9c and 9d that show that at point 13, i.e. across the load 14 resistance, the function representing the differential relation between voltage U'(t) and current I, that flows through load 14, has the negative slope:

$$\Delta U'(t)/\Delta I < 0 \qquad (9)$$

Schematic diagrams of the course of electrodynamic processes taking place in converter 9 are shown in FIG. 10: in case when primary winding 18 of transformer 9 is subjected to impulse signals from generator 20. The complete conformity of the pattern of voltages, registered by instrument 16 at point 13, with basic expression (7) is obvious.

When the load 14 resistance is blocked by capacitor 22 having nominal value C, and when the condition $1/\omega_1 C << R_{ld}$ is completed with then at point 13 instrument 16 resisters the voltage of the dc component of signals U'(t)

shown in diagrams in FIGS. 9c and 9d (FIGS. 11a–e), i.e. it registers the linear detection of high-frequency oscillations, with extraction of the modulating function in the proportions in accordance with expression (7). FIG. 11a shows signal $U_1(t)$ in three versions of its amplitude values: A, 2A, 3A. Accordingly, the converted signal (FIG. 11b, c, d) is represented in the form of the modulating function having minimal amplitude B, when $U_o=U_{omax}$.

In the case when at input of the circuit shown in FIG. 7 a complex periodic signal exists, e.g. sum of two harmonic oscillations $U_1 \sin \omega_1 t + U_2 \sin \omega_2 t$, then—the condition of $U_o >> |U_1+U_2|$ being maintained—instrument 16 at point 17 will register voltage of beats $U_1(t)$ and $U_2(t)$ (FIG. 12b), and at point 13 it will register the converted signal U'(t) in the form of the linear detection of these beats (FIG. 12b). If $R_{ld}$—resistor 14 is blocked by capacitor 22 (capacity C) and the condition $1/\omega_1 C << R_{ld}$, $1/\omega_2 C << R_{ld}$, $1/(\omega 1-\omega_2) >> R_{ld}$ is fulfilled, then voltage at point 33 represents the converted signal $U'_{od}(t)$ in the form of harmonic function $U'_{od} \sin(\omega_1-\omega_2)t$, i.e., the signal of the lower intermediate frequency (FIG. 12c).

If in the circuit according to FIG. 7, balancing resistor 12 is replaced with second converter 8, then signal of the efficient electromotive force U'(t) at point 13, under the condition $U_1(t)=U_1 \sin \omega_1 t$, will be registered by instrument 16, as shown in FIG. 13. Hence, the linear full-wave detection of $U_1(t)$—the signal at point 17—takes place. In this case, power of the converted signal grows during the period of action of $U_1(t)$ in all above-mentioned versions of usage of the circuit shown in FIG. 7.

Operation of converter 8 in the circuit according to FIG. 8 corresponds to the mode of the signal frequency-detection mode. At least two signals are supplied to input of summer 23; data carrier $U_1(t)=U_1 \sin \omega_1 t$ and heterodyne signal $U_2(t)=U_2 \sin \omega_2 t$; that being in the case when amplitude $U_1$ can vary within a range of values, the condition of $U_2 \geq U_{1max}$ must be met. When inductance L of choke 24 satisfies the condition $\omega L >> \rho$, where $\omega$ is the lower value of frequency of the acting signals; and blocking capacitor 22 is selected according to the ratio $1/\omega_{int} C << R_{ld}$, where $R_{ld}$ is load 14, $\omega_{int}$ is the lower value of the intermediate frequency, then in application of the converting signal $U_o$ (Uo>UΣ), where UΣ is the combined amplitude of the harmonic oscillators that act on converter 8, instrument 16 at point 13 will register signal $U'_{int}(t)=U_{int} \sin(\omega_2-\omega_1)t$, where $U_{int}$ is amplitude of the intermediate frequency signal $\omega_{int}=\omega_2-\omega_1$ (FIG. 12c).

It is noted that accords to expression (7), harmonic signal $U_h \sin(\omega_2/2)t$ can be selected as the converting signal. In this case source 15 is absent, but the condition $U_h >> U_1$, is satisfied, i.e. $U_h(t)$ simultaneously plays the role of the heterodyne signal and converting signal. All remaining signals applied to summer 23 are convertible. Signal $U_h(t)$ can act on input of summer 23 or directly on converter 8.

Now the ratios determining the possible optimal values of the signal conversion ratios in converter 8 must be found.

It follows from ratio (7) that $$\eta = \partial U'(t)/\partial U \tag{10}$$

where $\eta$ is conversion ratio, U(t) is convertible signal.

Thus it follows from expression (7) that:

$$|\eta|=(2\gamma R_x U_o)/(x_o l) \tag{11}$$

Expression (11) does not define limits of value $\eta$. But for the reason that converter 8 is a two-terminal device, then it can be concluded from examination of the circuits shown in FIGS. 7 and 8 and diagrams represented in FIGS. 9, 12 and 13 that the efficient electromotive force acts in antiphase with respect to U(t) on input of the device, i.e. a deep (100%) negative inverse relation is present, which relation also lowers the converter's input resistance.

Gain of a device having negative inverse relation $K_{inv.rel}$ if known to be determined as follows:

$$K_{inv.rel}=K/(1+\beta K) \tag{12}$$

where $\beta$ is inverse relation coefficient, K is gain of a given device when $\beta=0$. In the examined case of estimation of value $\eta$ for converter 8, the opening, i.e. the actual conversion coefficient $\eta_{act}$ is associated with physical coefficient $\eta$ (see expression (11)) according to the following ratio:

$$\eta_{act}=\eta/(1+\eta) \tag{13}$$

because in any method of connection of converter 8: $\beta=1$.

For the linear detection mode, transmission coefficient G of converter 8 will be expressed as:

$$G=(R_{ld}\eta_{act})/\rho \tag{14}$$

Expression (13) demonstrates that the objective to design two-terminal converters 8 is reduced to conformance with the condition $\eta \geq 1$, i.e.

$$(2\gamma|Rx|U)/(x_o l) \geq 1 \tag{15}$$

It should be noted that the higher is value of $\eta$, the more pronounced is manifestation of the self-matching process of converter 8 with wave-impedance of channel of relaying input signals U(t).

For estimation of noise factor of converter 8, it should be noted that expression (7) is true only when the action of external signals U(t) is the issue. Therefore, the "internal" electromotive force of the converter 8 conductor noise acts upon the converter proper only in the form of the external voltage developed across load 14 and at input of the converter, i.e. developed in the wave-impedance of the signal U(t) relaying channel. Thus, the noise power of converter 8 influences the process of conversion of signal U(t) only to the extend that is provided by a voltage divider; $R_{inp}/\rho$, $R_{ld}/\rho$, where $\rho$ is value of resistance of converter 8, $R_{inp}$ is input resistance of the conversion circuit, $R_{ld}$ is resistance of load 14.

It should be noted that in the above-described ratios, that characterise operation of converter 8, such parameter as specific conductance $\sigma$ of the conductor material is not included. Nonetheless, this parameter must be taken into account, because together with the geometric parameters; $x_o$, l and $\alpha$ (for film resistors) said parameter determines magnitude of a predetermined value of $\rho$, that is resistance of converter 8. Values of l being small, it will be, obviously, easier to obtain the required value of $\rho$ than in the case when materials having a low value of $\sigma$ are used.

For the reason that value of converting signal $U_o$ is comprised by expression (15) as the parameter determining the conversion efficiency, the maximal permitted value $U_{omax}$ in design of converter 8 should be determined. The limiting factor, that influences selection of $\sigma$ of a material and values of Uo (apart from the requirement to maintain the thermal balance), is the possible appearance of the non-linear dependence of the converter's material conductive properties on the nature of interrelationship of its physical and geometric parameters. When values of l and $x_o$ are low, then in the two-terminal devices manufactured of the materials having a great value of $R_x$, the effect of non-linearity of its volt-amper characteristic $I \equiv U^3$ manifests itself, where U is sum of the voltages acting on the converter. The relevant conversion ratio, $\eta_{nonlin}$, caused by said non-linearity of the I(U) dependence, can be expressed as follows:

$$\eta_{nonlin} = k(\sigma R_x^2 U^2)/x_o l^2 \quad (16)$$

where k is dimension factor. It is obvious from (16) that $\eta_{nonlin}$ becomes lower as $\sigma$ of the material and maximum value of $U_{max}$ acting upon the converter decrease.

The conversion process according to (16) affects operation of the converter in the mode of the linear detection of signals. In the case when the converter performs the frequency conversion, the conversion mode according to (16) provides an additional increase in the converted signal power owing to distribution of the converted input signal's power in channels of the upper and lower intermediate frequencies.

The author has conducted the experimental trial of the converter according to the invention; under the conditions of comparative estimate of the ultimate sensitivity of receiving radio devices within the range of 1 GGz÷6 GGz, and using the known crystalline mixers, having the least noise coefficient, and the claimed converter as the converting devices at input of the receiving path. The attained gain is 6÷7 dB.

In view of the relative ease of the technique for manufacturing the converter according to the invention in respect of production of semiconductor elements, the proposed invention, aside from the merely technical advantages offers a certain economic gain.

What is claimed is:

1. An electric signal converter comprising:
   a converting element, in the form of a two-terminal device, made of a conductive material intended for being supplied with at least two input signals and for extracting a converted signal, wherein a relation between physical parameters and geometric parameters of the converting element and a sum of voltages of the input signals satisfies following condition:

$2\gamma |R_x| U/x_o l > 1$, where U is the sum of the voltages of the input signals,
   $R_x$ is Hall coefficient of the conductive material of the converting element, (C/m³);
   l is a length of the converting element along a current direction, (m);
   $x_o$ is a least one of linear dimensions of the converting element cross section that is perpendicular to a direction of a current flowing therein, (m);
   $\gamma = \tau \cdot \epsilon_0$, $\epsilon_0$ is an electric constant, $\epsilon_0 = 10^{-11}$ C/V·m, $\tau$ is a dimensionless factor that represents a degree of interrelationship of fields produced in the conductive material by the input signals.

2. The converter according to claim 1, wherein the voltage of at least one of the input signals is considerably greater than that of each of the other input signals, said at least one input signal of the considerably greater voltage being a converting signal, and the other input signals being signals to be converted.

3. The converter according to claim 1, wherein the converting element comprises
   a dielectric substrate;
   a thin film having a thickness $x_0$ disposed on said dielectric substrate; and
   leads disposed in a plane of said film at the distance l.

4. The converter according to claim 1, wherein the converting element is implemented in a form of a cylinder having a radius $x_0$ and a length l, provided with leads connected to ends of the cylinder.

5. The converter according to claim 1, wherein the converting element is implemented in a form of a fine-grained structure having linear dimensions of a grain of an order of $x_0$, l, provided with leads to provide a contact with at least one grain.

6. The converter according to claim 5, further comprising a substrate, wherein said fine-grained structure is disposed on said substrate.

7. The converter according to claim 6, wherein said substrate being one of the leads, the other lead directly contacting said grain and having a contact area whose linear dimensions are of the order of those of the grain.

8. The converter according to claim 1, wherein the converting element is implemented in a form of at least one micro-asperity on a surface of said conductive material, said at least one micro-asperity having a height l and a cross-section size $x_0$, and said converting element further comprises a lead connected to a micro-asperity apex.

9. The converter according to claim 1, wherein said conductive material is a material with a high value of Hall coefficient.

10. The converter according to claim 1, wherein the factor $\tau$ being within a range of $10^{-3} \div 10^{-2}$.

11. A method for converting electrical signals, comprising the steps of:
    providing a converting element in a form of a two-terminal device made of a conductive material;
    applying at least two input signals to said converting element;
    converting said input signals by providing interaction of fields of said signals in the converting element material, which interaction is accompanied by energy interchange resulting in producing an effective electromotive force of converting; and
    extracting a converted signal that satisfies following relation:

$$U'(t) = \frac{-\gamma |R_x| \{\Sigma U_i(t) \cdot |U_o(t)| + U_o(t) \cdot |\Sigma U_i(t)|\}}{x_o l} \quad (7)$$

where U'(t) is an effective electromotive force across the converting element caused by an action of input signal voltages;
    $R_x$ is Hall coefficient of the conductive material of the converting element, (C/m³);
    l is a length of the converting element along a current direction, (m);
    $x_0$ is a least one of linear dimensions of a converting element cross-section that is perpendicular to a direction of a current flowing therein, (m);
    $\gamma = \tau \cdot \epsilon_0$, $\epsilon_0$ is an electric constant, $\epsilon_0 \approx 10^{-11}$ C/V·m, $\tau$ is a dimensionless factor that represents a degree of interrelationship of fields produced in the conductive material by the input signals;
    $\Sigma U_i(t)$, where i=1, . . . ,n, is a combined voltage of the input signals to be converted; $U_0(t)$ is a voltage of an input converting signal;
    wherein a relation between physical parameters and geometric parameters of the converting element and the sum of the voltages of the input signals is selected according to a following condition:

$(2\gamma |R_x| U)/(x_0 l) \geq 1$, where U is a voltage across the converting element, equal to the sum of the voltages of the input signals.

12. The method according to claim 11, wherein the voltage $U_0(t)$ of the input converting signal is selected to be significantly greater than the voltage of each of the input signals to be converted, for providing a power of the converted signal by power take-off from the input converting signal.

13. The method according to claim 11, wherein extracting of the converted signal is performed by an intermediate frequency filter.

14. The method according to claim 11, wherein extracting of the converted signals is performed by a full-wave circuit through compensation of the combined voltage $\Sigma U_i(t)$ of the input signals to be converted at an electric neutral point of said circuit.

15. The method according to claim 11, wherein to obtain the converted signal having a low value of an intermediate frequency, the input converting signal is selected as a harmonic signal $U_0(t)$ having a frequency proximate to a half of a frequency of the input signal to be converted.

16. The method according to claim 11, wherein the voltage $U_0(t)$ of the input converting signal is selected as a voltage of a direct current source; thereby converting of the input signals is carried out in a linear detection mode.

17. The method according to claim 11, wherein the factor $\tau$ being within a range of $10^{-3} \div 10^{-2}$.

* * * * *